United States Patent [19]

Takezaki

[11] 4,296,375
[45] Oct. 20, 1981

[54] LEVEL INDICATOR FOR INDICATION OF MAXIMUM VALUES

[75] Inventor: Tsuneo Takezaki, Kadoma, Japan

[73] Assignee: Matsushita Electric Industrial Company, Kadoma, Japan

[21] Appl. No.: 29,714

[22] Filed: Apr. 13, 1979

[30] Foreign Application Priority Data

Apr. 14, 1978 [JP] Japan .................. 53/50086[U]

[51] Int. Cl.³ .......................................... G01R 19/04
[52] U.S. Cl. .................... 324/103 P; 324/96; 324/122
[58] Field of Search ............ 324/103 P, 122, 96, 324/99 D

[56] References Cited

U.S. PATENT DOCUMENTS

| | | | |
|---|---|---|---|
| 3,927,571 | 12/1975 | Athey | 324/96 |
| 3,952,247 | 4/1976 | Horichi | 324/122 X |
| 3,969,672 | 7/1976 | Wallander et al. | 324/122 X |
| 3,987,392 | 10/1976 | Kugelmann et al. | 324/96 |
| 4,004,220 | 1/1977 | Kerber et al. | 324/96 X |
| 4,006,412 | 2/1977 | Campbell et al. | 324/96 |
| 4,055,733 | 10/1977 | Holsinger et al. | 324/99 D X |
| 4,149,149 | 4/1979 | Miki et al. | 324/96 X |
| 4,149,150 | 4/1979 | Miyakawa et al. | 324/96 X |
| 4,166,245 | 8/1979 | Roberts | 324/103 P |
| 4,177,424 | 12/1979 | Knittel | 324/103 P X |
| 4,183,025 | 1/1980 | Kutaragi et al. | 324/103 P |
| 4,213,125 | 7/1980 | Watanabe | 324/122 X |

Primary Examiner—Stanley T. Krawczewicz
Attorney, Agent, or Firm—Lowe, King, Price & Becker

[57] ABSTRACT

A level indicator comprising a plurality of comparators for comparing an analog signal with a respective value of graduated reference voltages generates one or more output signals in response to the analog signal exceeding each reference voltage. A plurality of storage circuits is provided each associated with a respective comparator and with a respective one of successively arranged luminous elements. Each storage circuit is responsive to the output of the associated comparator and delivers a signal for the associated luminous element, which signal may also be used to inhibit the passage of the outputs of the other storage circuits of descending order.

15 Claims, 3 Drawing Figures

LEVEL INDICATOR FOR INDICATION OF MAXIMUM VALUES

BACKGROUND OF THE INVENTION

The present invention relates to a level indicator for indicating the voltage level of an analog signal using a plurality of successively arranged luminous elements which may be incandescent lamps, light-emitting diodes, liquid crystals, fluorescent elements, or the like.

Level indicators using plural luminous elements, such as liquid crystals or light-emitting diodes, have been developed for providing a visual display of analog signals. However, the maximum indicated value may rapidly move from one element to another if the input signal varies rapidly. It is often desirable that the maximum peak value be displayed for a period sufficient for the user to recognize it. Prior attempts have, however, failed in providing a low cost level indicator of this type for widespread use.

SUMMARY OF THE INVENTION

An object of the present invention is therefore to provide an inexpensive level indicator for displaying analog signals in discrete values.

According to the invention, a level indicator comprises a plurality of comparators for respectively comparing an input analog signal with a respective value of graduated reference voltages to generate one or more output signals in response to the analog signal exceeding each reference level. The outputs of the comparators are coupled to associated luminous elements to indicate the instantaneous value of the analog signal by the location of the energized individual luminous elements. A plurality of storage circuits, such as flip-flop or RC time constant circuits, is provided, so each storage circuit is associated with a comparator to store the output signal from the associated comparator. The output signal from each storage circuit is used to inhibit the passage of the output signals of the other storage circuits of descending order so that only the comparator output signal which corresponds to the maximum level is passed to the associated luminous element. The use of flip-flops is particularly advantageous in some applications where the storage time is manually or automatically controlled in response to different modes.

BRIEF DESCRIPTION OF THE DRAWINGS

The invention will be further described by way of example with reference to the accompanying drawings, in which.

DETAILED DESCRIPTION OF THE PREFERRED EMBODIMENTS

Figure 1:
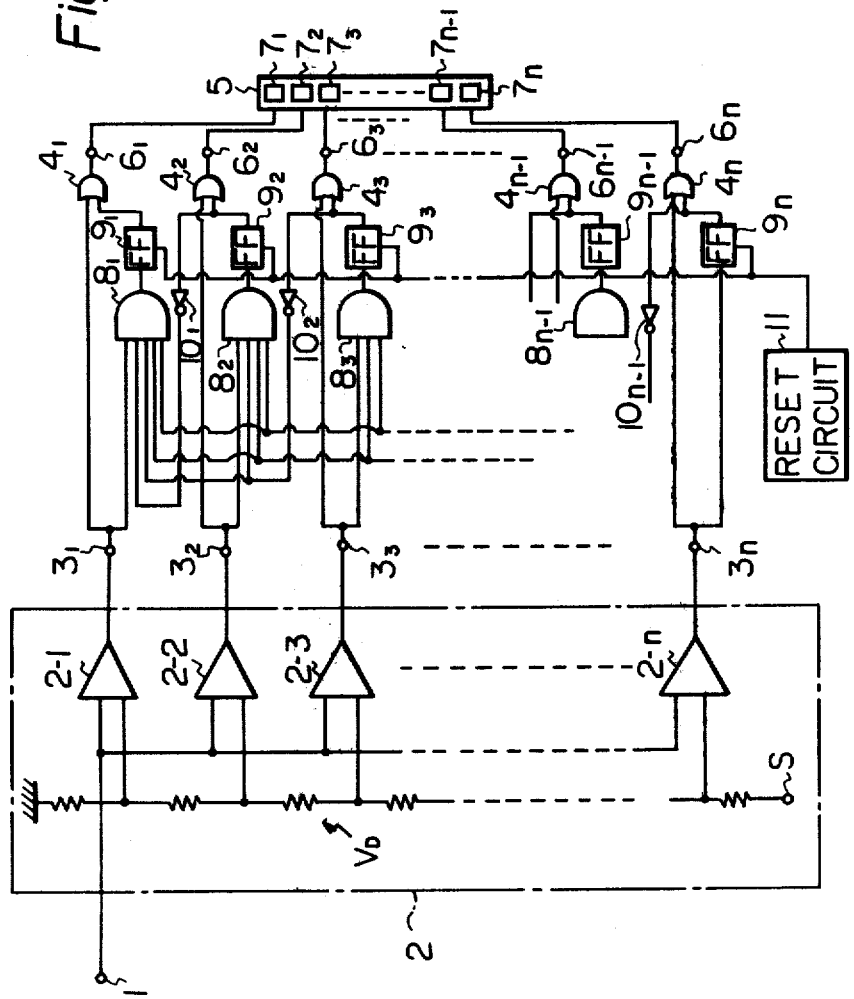
FIG. 1 is a circuit block diagram of a first embodiment of the invention.

Referring now to FIG. 1, a level indicator of the present invention is illustrated as comprising an analog-to-digital converter or voltage comparator 2 which comprises a plurality of comparators $2_1$ to $2_n$. Each comparator has a first input terminal connected to an input terminal 1 to which an analog input signal is applied, and a second input terminal which receive a respective one of graduated reference voltages from a voltage divider $V_D$ formed by resistors series connected between a voltage supply terminal S and ground. When the input signal at terminal 1 is at zero voltage the outputs of the comparators $2_1$ to $2_n$ are all at zero logic level. As the input voltage level increases from zero the comparator $2_1$ is first switched to a logic "1" level; in response to a further voltage increase the comparator $2_2$ generates a logic "1" signal while the comparator $2_1$ remains switched to the logic "1" level. It is appreciated that when the input voltage reaches a maximum level all the comparators are switched to logic "1" level, so that the number of comparators that generate logic "1" signal is proportional to the input voltage level.

The output terminals $3_1$ to $3_n$ of comparators $2_1$ to $2_n$ are respectively coupled through OR gates $4_1$ to $4_n$ to luminous elements $7_1$ to $7_n$, respectively. Elements $7_1$ to $7_n$ are equally spaced apart and arranged in a one-dimensional array in an indicator tube 5. The luminous elements may either be light-emitting diodes or fluorescent electrodes within an evacuated envelope. In response to logic "1" signals from the comparators $2_1$ to $2_n$ the luminous elements $7_1$ to $7_n$ are correspondingly excited to emit light. The number of excited elements thus indicates the level of input analog signal.

According to the invention, a plurality of AND gates $8_1$ to $8_{n-1}$ and a plurality of flip-flops $9_1$ to $9_n$ are provided. One input of AND gate $8_1$ is derived from the terminal $3_1$ with other inputs to gate 8, being from the outputs of flip-flops $9_2$ to $9_n$ via respective NOT circuits $10_1$ to $10_{n-1}$; a portion of this portion of the circuit is omitted from FIG. 1 for simplicity. Similarly, one input of AND gate $8_2$ is derived from the terminal $3_2$, with other inputs to gate 8, being from the outputs of flip-flops $9_3$ to $9_n$ via respective NOT circuits $10_2$ to $10_{n-1}$. Inputs of flip-flops $9_1$ to $9_{n-1}$ are derived from the outputs of AND gates $8_1$ to $8_{n-1}$, respectively; the input of flip-flop $9_n$ is derived from terminal $3_n$. The outputs of the flip-flops $9_1$ to $9_n$ are coupled through OR gates $4_1$ to $4_n$ to luminous elements $7_1$ to $7_n$ respectively.

The operation of the circuit of FIG. 1 is as follows, based on the assumption that the voltage level of the input signal at terminal 1 is initially such that comparators $2_1$ and $2_2$ are switched to high output state and comparators $2_3$ to $2_n$ are in the low or logic "0" state or logic "1" state, resulting in the luminous elements $7_1$ to $7_2$ being excited through OR gates $4_1$ and $4_2$ to emit light. Simultaneously, the high level output from the comparator $2_2$ is applied to the AND gate $8_2$ which sets flip-flop $9_2$, that in turn inhibits the AND gate $8_1$ through NOT circuit $10_1$. The high voltage signal from the flip-flop $9_2$ is coupled through OR gate $4_2$ to the luminous element $7_2$ so that element $7_2$ continues to emit light even though the input signal at terminal 1 drops to a lower level. If it is assumed that the input signal increases from the previous level so that the comparators $2_1$, $2_2$ and $2_3$ are switched to logic "1" level, the input to AND gate $8_3$ from the comparator $2_3$ turns on flip-flop $9_3$, that in turn activates luminous element $7_3$ which continues to emit light even though the input signal drops to a lower level. Since flip-flop $9_2$ is in set condition, luminous element $7_2$ remains excited.

The flip-flops $9_1$ to $9_n$ may be reset in response to a reset pulse applied from a circuit 11. This reset pulse may be manually applied or automatically applied at regular intervals to clear the previous peak level and activate only one luminous element to indicate the most recent peak level. This reset signal may also be used to hold the flip-flops $9_1$ to $9_n$ in a reset condition to allow the indicator 5 to indicate the instantaneous values of the input signal.

Figure 2:
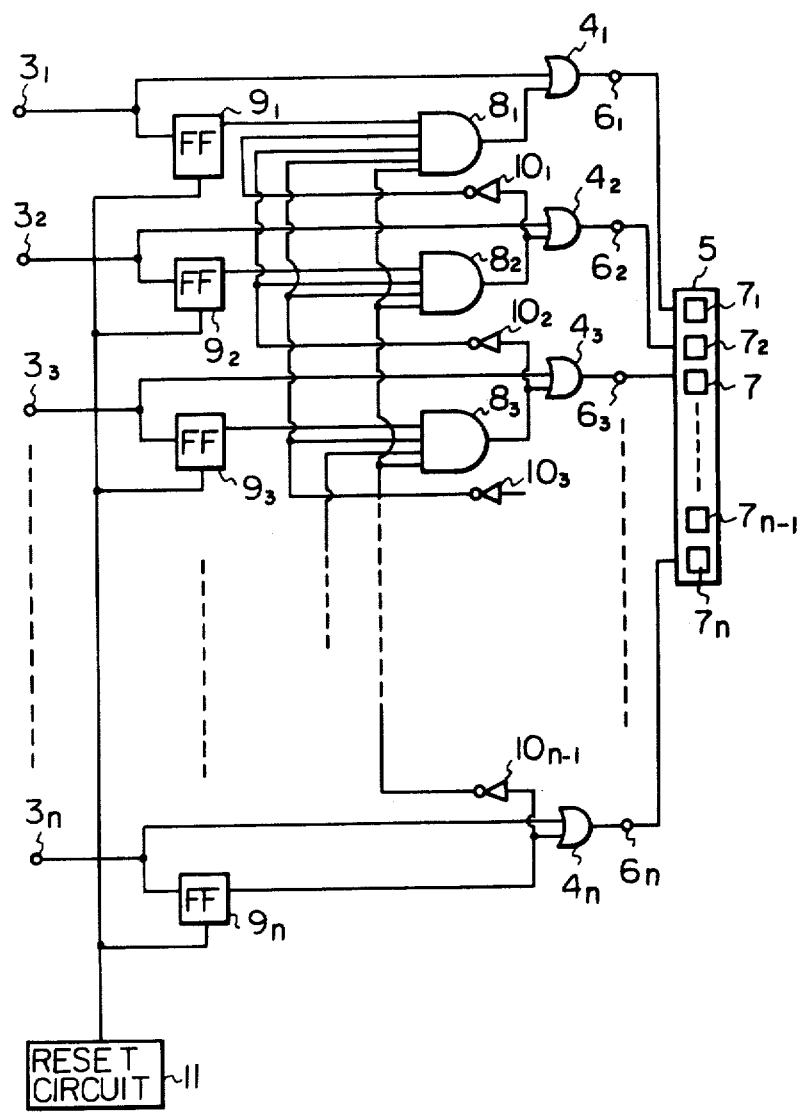
FIG. 2 is a circuit block diagram of a second embodiment of the invention.

The embodiment of FIG. 1 can be modified as shown in FIG. 2 in which the flip-flops $9_1$ to $9_{n-1}$ (not shown) are connected between the terminals $3_1$ to $3_{n-1}$ (not shown) and AND gates $8_1$ to $8_{n-1}$ (not shown). In this modification, the operation is as follows, based on the assumption that the input signal has such a level that terminals $3_1$ to $3_3$ are switched to a high voltage level, while terminals $3_4$ to $3_n$ are at a low voltage level. This results in excitation of luminous elements $7_1$ to $7_3$. The flip-flops $3_1$ to $3_3$ are driven into set condition. However, the output from the flip-flop $9_3$ is passed through AND gate $8_3$ and inverted by NOT circuit $10_2$ to thereby inhibit AND gates $8_1$ and $8_2$, so that only the luminous element $7_3$ continues to emit light to indicate the peak level after termination of the input signal. If the input signal then rises above the previous level, flip-flop $9_4$ is triggered so that AND gate $8_3$ is inhibited by a low level signal from NOT circuit $10_3$. When the input signal drops to a lower level the luminous element $7_3$ is turned off and element $7_4$ remains turned on. Therefore, it will be understood that the previous peak level is cleared and only one luminous element emits light to indicate the most recent maximum peak level.

Figure 3:
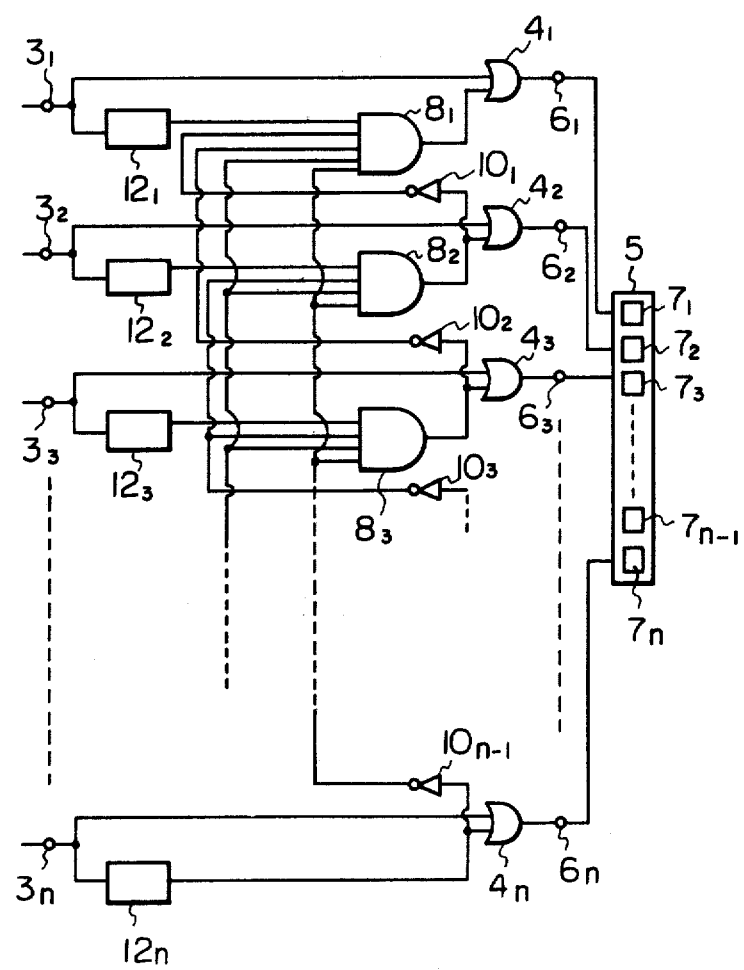
FIG. 3 is a modification of the embodiment of FIG. 2.

In applications where the period of peak level indication extends no more than several minutes, the flip-flop circuits $9_1$ to $9_n$ of the FIG. 2 embodiment may be replaced with RC time constant circuits $12_1$ to $12_n$ as illustrated in FIG. 3. The maximum peak level remains indicated for the period of each time constant value without the use of a reset circuit.

It is to be noted that in the embodiments of FIG. 2, the reset input of each flip-flop may be connected to the output terminal of the other flip-flop of ascending order or higher signal level.

What is claimed is:

1. A level indicator system having a plurality of successively located luminous elements arranged to indicate the level of an input voltage by their respective location, comprising:
   means for providing a plurality of graduated reference voltages;
   a plurality of comparators each associated with a respective luminous element, each comparator having a reference input terminal biased at a respective reference voltage and a signal input terminal responsive to said input voltage, each comparator deriving an output signal in response to the voltage at the signal input terminal thereof exceeding the reference voltage at said reference input terminal; and
   a plurality of storage circuits each associated with a respective luminous element and a respective comparator and responsive to a respective comparator output signal for delivering an output signal to the associated luminous element.

2. A level indicator system as claimed in claim 1, further comprising means responsive to an output signal from each of said storage circuits for annihilating the output signals of the storage circuits associated with the luminous elements of descending order.

3. A level indicator system as claimed in claim 1 or 2, further comprising a plurality of OR gates each associated with a respective comparator, a respective storage circuit and a respective luminous element and having a first input terminal connected to the output of the associated comparator and a second input terminal connected to the associated storage circuit and an output terminal connected to the associated luminous element.

4. A level indicator system as claimed in claim 3, wherein each of said storage circuits comprises a flip-flop each having a set input terminal connected to the output terminal of the associated comparator and a reset input connected to the reset input of the other flip-flops, and an output terminal connected through the associated OR gate to the associated luminous element, further comprising a resetting circuit connected to said reset input terminals of said flip-flops.

5. A level indicator system as claimed in claim 1, wherein each of said storage circuits comprises an RC time-constant circuit.

6. Apparatus for indicating the magnitude of an input signal comprising an array of luminous elements, each of said elements being energized to a light emitting state in response to an electrical energization signal, said array having a spatial arrangement so that the position of the light emission indicates the magnitude of the input signal, means responsive to the input signal for supplying the electrical energization signal to the elements of the array so that an element of the array corresponding to the maximum value of the input signal over a specified interval remains energized for the remainder of the interval even though the magnitude of the input signal drops below the value associated with the element corresponding to the maximum value, the energization signal being decoupled from all elements associated with values equal to and less than the element associated with the maximum value upon completion of the specified interval, the means for supplying the energization current including, for each element, comparator means responsive to the input signal for deriving a predetermined binary level only in response to the input signal magnitude exceeding a predetermined value, the predetermined value being different for each comparator means, and signal storage means responsive to the comparator means for deriving the energization signal during the period beginning with the derivation of the predetermined binary level and ending at the completion of the interval.

7. The apparatus of claim 6 wherein the storage means includes means for completing the interval a predetermined time after the predetermined binary level is derived.

8. The apparatus of claim 7 wherein the storage means for each element comprises an RC time constant circuit.

9. The apparatus of claim 6 wherein the storage means includes means for completing the interval at regular intervals.

10. The apparatus of claim 6 wherein the storage means includes means for completing the interval in response to a manually applied signal.

11. The apparatus of claim 6 wherein the storage means for each element includes a bi-stable element responsive to the predetermined binary level.

12. The apparatus of claim 8 wherein the storage means for each element includes a flip-flop responsive to the predetermined binary level, and means for resetting the flip-flop at regular intervals.

13. The apparatus of claim 8 wherein the storage means for each element includes a flip-flop responsive to the predetermined binary level, and means for resetting the flip-flop in response to a manually applied signal.

14. The apparatus of claim 6, 7, 8, 9, 10, 11, 12 or 13 further including means for supplying the energization signal only to the element associated with the maximum value of the input signal.

15. The apparatus of claim 6, 9, 10, 11, 12 or 13 further including means for supplying the energization signal to the element associated with the maximum value of the input signal, and the elements associated with all values of the input signal less than the maximum value.

* * * * *